(12) United States Patent
Herman

(10) Patent No.: US 7,180,152 B2
(45) Date of Patent: Feb. 20, 2007

(54) PROCESS FOR RESURF DIFFUSION FOR HIGH VOLTAGE MOSFET

(75) Inventor: Thomas Herman, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/888,690

(22) Filed: Jul. 8, 2004

(65) Prior Publication Data

US 2006/0006555 A1    Jan. 12, 2006

(51) Int. Cl.
*H01L 23/58* (2006.01)
(52) U.S. Cl. .................. 257/492; 257/491; 257/496; 257/E21.531; 257/E21.537
(58) Field of Classification Search ............. 257/492, 257/496

See application file for complete search history.

(56) References Cited

U.S. PATENT DOCUMENTS

| 5,661,314 | A | * | 8/1997 | Merrill et al. | ............ 257/144 |
| 5,747,853 | A | * | 5/1998 | So et al. | ............ 257/355 |
| 5,861,657 | A | * | 1/1999 | Ranjan | ............ 257/492 |
| 6,100,572 | A | * | 8/2000 | Kinzer | ............ 257/492 |
| 6,593,594 | B1 | * | 7/2003 | Alok | ............ 257/77 |
| 6,949,424 | B2 | * | 9/2005 | Springer | ............ 438/202 |

* cited by examiner

*Primary Examiner*—Andy Huynh
*Assistant Examiner*—Dao H. Nguyen
(74) *Attorney, Agent, or Firm*—Ostrolenk, Faber, Gerb & Soffen, LLP

(57) ABSTRACT

A starting wafer for high voltage semiconductor devices is formed by implanting arsenic into the top surface of a p type silicon substrate wafer to a depth of about 0.1 micron. A N type non-graded epitaxial layer is then grown atop the substrate without any diffusion step so that the arsenic is not intentionally driven. Device junction are then diffused into the epitaxially grown layer.

8 Claims, 3 Drawing Sheets

PROCESS FOR RESURF DIFFUSION FOR HIGH VOLTAGE MOSFET

FIELD OF THE INVENTION

This invention relates to semiconductor device processing and more specifically relates to a novel process for manufacture of and structure for silicon wafers which are to be used in the fabrication of semiconductor devices.

BACKGROUND OF THE INVENTION

It is common in semiconductor device fabrication to form an epitaxially-deposited silicon junction-receiving layer atop a silicon wafer. The epitaxial layer will have a low concentration of N or P impurities while the substrate is a thicker and higher concentration layer. Any desired type of junction pattern is then formed in the epitaxial layer to form known devices such as MOSFETs, IGBTs, diodes, integrated circuits, and the like.

High voltage semiconductor devices commonly employ a resurf region which is a low concentration region between areas of high potential difference. The resurf region depletes as the voltage difference increases, and is fully depleted before the maximum voltage difference is applied. In the double resurf technique, there are two resurf regions of opposite polarities, both of which deplete as the applied potential difference increases. Such a device and the advantages of using the double resurf technique is detailed in U.S. Pat. No. 4,866,495.

In high voltage devices employing the double resurf technique, the resurf region of one polarity is created by implantation and diffusion of appropriate dopants into an epitaxially grown layer of opposite polarity. The epitaxial region pinched by the diffused resurf region serves as the second resurf region. High breakdown voltage is achieved when the charge in the top (diffused) resurf layer is controlled at approximately $1 \times 10^{12}$ cm$^2$ and the charge in the lower (pinched epitaxial) resurf region is controlled at approximately 1.5 to $2 \times 10^{12}$ cm$^2$. One outcome of such a construction is that as the depth of the diffused resurf layer varies slightly, the charge in the pinched epi region varies substantially so that control over breakdown voltage is lost. This effect has to be offset by using a thicker epitaxial layer. The thicker epitaxial layer has several drawbacks:

1. Deeper isolation diffusions are needed to electrically isolate different parts of the circuit on an integrated circuit from each other, requiring longer diffusion times at temperatures at or above 1200° C., resulting in lower throughput.
2. Very long diffusion times at 1200° C. or above, causes more defects resulting in lower yield.
3. The long diffusion times at 1200° C. or above also results in a wider isolation diffusion, due to greater lateral diffusion, thus reducing the amount of useful area on a chip.

U.S. Pat. No. 5,861,657 issued Jan. 19, 1999 to Niraj Ranjan and assigned to the assignee of the present application, proposes an improvement to the above, whereby the thickness of the epitaxial layer is substantially reduced, and the charge distribution is modified. Thus, the majority (greater than about 75% and preferably greater than 80%) of the bottom resurf charge (pinched epi region) is disclosed as contained in the bottom 1 to 4 microns of the epi or in about the bottom 25% or preferably 20% of the epi. The top portion of the epi is much more lightly doped and contains a very small portion of the bottom resurf charge.

The increased charge in the lower epitaxial region is introduced at the beginning of the wafer manufacture process by either of two means:
1. Through implantation of appropriate dopants into the substrate wafers followed by diffusion, prior to epitaxial growth of the lightly doped region.
2. Through an epitaxial growth process in which a thin heavily doped epitaxy is grown first followed by a thicker lightly doped epi growth.

In the resulting structure, a variation of the depth of the top (diffused) resurf region will have a much smaller effect on the charge contained within the pinched region beneath it. This results in a better control over breakdown voltage with a much thinner epitaxial layer for a given breakdown voltage. The thinner epitaxial layer, in turn, reduces the diffusion processing time needed for forming isolation diffusions and the isolation diffusions have a smaller lateral extent and take up less chip area.

BRIEF DESCRIPTION OF THE INVENTION

In accordance with the invention, a very shallow arsenic or other slow diffusing dopant, for example, less than about 0.3 micrometers in depth, is implanted into a P type silicon substrate before the growth of a conventional N type, non graded epitaxial junction-receiving layer. No intentional diffusion step is used following this shallow implant, other than the subsequent thermal steps used in forming subsequent diffusions in the subsequently grown epitaxial layer. An epitaxially grown N layer having a thickness, typically, of 3 to 6 micrometers is then grown atop the shallow implant. A resurf region about 1 micrometer thick is then diffused into the epi layer.

After the formation of the junction patterns, the initially diffused arsenic will deepen to, for example, about 3 micrometer in depth. In contrast, the prior art (U.S. Pat. No. 5,861,657) suggests that either phosphorus or arsenic should be implanted and then diffused to a depth in the P substrate to a depth of 1 to 2 micrometers. After the conventional diffusion steps to form the devices, this initial implant will deepen to far more than 3 micrometers for the same subsequent thermal treatments.

By employing the ultra shallow implanted N buffer region in the P substrate, it was found that there is a much better distribution and control of the total N carrier concentration in the epitaxial layer, leading, for example, to much better controlled and more predictable resurf diodes.

Further, with the novel process of the invention, about 40% of the charge in the junction receiving layer is at the bottom of the layer, in contrast to the 70% taught in U.S. Pat. No. 5,861,657.

It is important that the implanted layer stay as narrow as possible. Thus, slower diffusing arsenic is required, not phosphorus. In a preferred embodiment, the initial arsenic implant is only approximately 0.1 micrometer in depth into the P substrate before the growth of a non-graded N type epitaxial layer.

Immediately after the implant, no intentional thermal diffusion is carried out to specifically diffuse the arsenic into its substrate. There is of course later incidental diffusion that drives the arsenic because of the other thermal steps necessary to fabricate the device.

The advantage of the novel invention is that it provides much greater control and precision of the net, total N-type doping in the epitaxial layer, which, for example, is critical for a resurf device intended to block 600 to 1200 volts.

DETAILED DESCRIPTION OF THE DRAWINGS (a) The Prior Art

Figure 1:
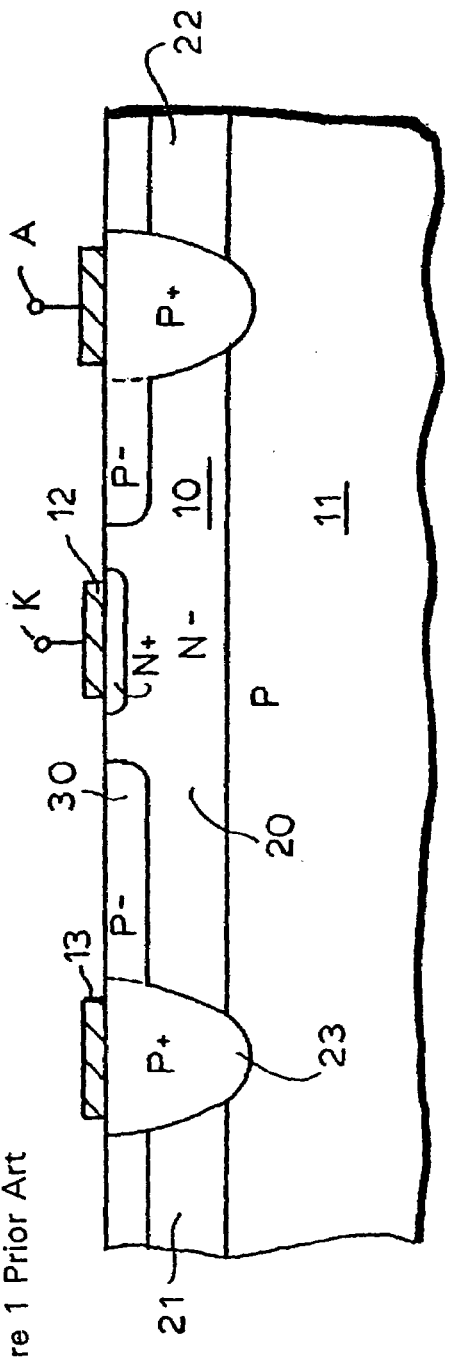
FIG. 1 shows a cross-section of a portion of a chip containing a high voltage diode in an isolated well in a conventional prior art wafer epitaxial layer.

Referring first to FIG. 1, there is shown a prior art, horizontal conduction diode, the junctions of which are formed in an N⁻ well 10 of an N⁻ epitaxial layer of monocrystalline silicon, deposited atop a P type substrate 11. An N+ diffusion provides a low resistance contact to cathode electrode 12 having terminal "K". Ring-shaped electrode 13 is the device anode "A".

The epitaxial layer 10 (sometimes termed "epi") is divided into a plurality of isolated wells 20, 21 and 22 as by one or more P type isolation diffusions such as diffusion 23 which may be ring-shaped in topology, but can have any other desired topology. Anode contact 13 is deposited atop P+ region 23. Diffusion 23 must be deep enough to intercept the P/N boundary between regions 10 and 11 in order to isolate regions or wells 20, 21 and 22. Wells 21 and 22 may contain any desired junction pattern, forming diodes, MOS-gated devices and/or bipolar devices in any desired discrete or integrated circuit configuration.

When the device of FIG. 1 is a high voltage device, for example, greater than 600 volts, a ring-shaped resurf P⁻ region 30 may be provided, which has a total charge of about $1 \times 10^{12}$ atoms/cm² and tends to fully deplete when the maximum reverse voltage is applied between the electrodes 12 and 13 of the diode. In order to prevent punch-through breakdown under reverse bias, the prior art epitaxial layer 10 for high voltage application, for example, 600 volts or greater, was made about 20 to 25 microns thick and had a uniform N⁻ resistivity measured at its surface of about 3 ohm cm.

As a result of the relatively thick epitaxial layer 10, the P type isolation diffusion 23 also becomes relatively wide due to lateral diffusion. This causes the diffusion 23 to occupy a relatively large portion of the total chip area, reducing the useful area of the various junction-containing wells. Furthermore, the thicker epitaxial layer 10 increases the cost of the wafer from which the individual chips (or die) are formed, increases processing time and causes additional damage due to the need for longer high temperature processing time.

Region 30 is typically about 5 microns deep. As this depth changes as due to manufacturing variance, the epi pinch beneath region 30 will have a major effect on the underlying charge, unless that charge concentration is reduced as by using a large epi volume beneath region 30.

Figure 2:
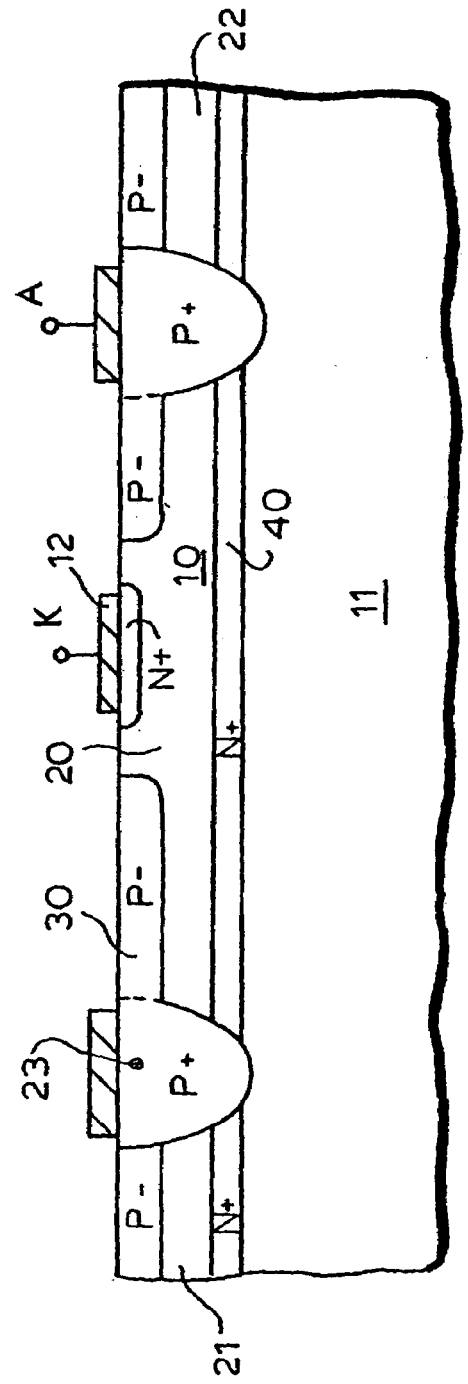
FIG. 2 shows a prior art structure which redistributes charge in the epitaxial layer of FIG. 1, permitting the use of a thinner epitaxial layer and better control of breakdown voltage.

FIG. 2 shows the prior art structure of U.S. Pat. No. 5,861,657 in which numerals similar to those FIG. 1 designate similar elements. The same total concentration of N carriers in layer 10 of FIG. 1 is employed in FIG. 2, but is redistributed by putting a larger percentage of the total concentration in a small thickness portion 40 at the bottom of the epitaxial layer 10. For example, region 40 has a thickness of from 10% to 40% of the total thickness of layer 10, and will have two to four times the concentration of layer 10. However, the combination of thickness and concentration of region 40 should result in a total charge 1.2 to $1.5 \times 10^{12}$ cm⁻² in this region. Region 40 is 2 microns thick (when formed) and has a doping concentration of about $7 \times 10^{15}$ atoms cm⁻³. The charge in the arsenic implant layer is about 70% of the total charge in both the implant layer and the epi layer.

By redistributing the total charge in region 10 the thickness of the epitaxial layer or region 10 is reduced substantially, for example, from 20 microns to 10 microns for a breakdown voltage of 600V. This then substantially reduces the depth needed for isolated diffusion 23, and thus its lateral area. Consequently, more area is preserved on the chip for active circuits or components. Furthermore, the time needed to drive the diffusion 23 is substantially reduced, for example, from 24 hours for a 20 micron thick epi to 6 hours for a 10 micron thick epi.

Finally, since only a small part of the part total charge in the pinched epi region under the resurf region 30 comes from the top portion of the epi (region 10), variation in the depth of region 30 will have a smaller effect on the charge in the pinched epi region.

The substrate 11 may be any conventional P-type substrate, and may have a thickness of from 5 to 25 mils. The resistivity of the substrate is chosen based on the breakdown voltage requirement. For example, for a 600V breakdown voltage, the substrate 11 resistivity is about 60 ohm cm and for 1200V its resistivity is approximately 150 ohm cm.

The epi layer portion 40 for a 600 volt device in prior art FIG. 2 is first grown with a relatively low resistivity, for example, 0.5 to 1 ohm cm and a thickness of 1 to 4 microns. A combination of thickness and resistivity for region 40 is chosen such that the total charge of this layer is 1.2 to $1.5 \times 10^{12}$ cm⁻² resulting in an epitaxial sheet resistance of 3000 to 4000 ohms per square.

The relatively heavily doped region 40 (compared to region 10) is disclosed as being created by implanting phosphorus or arsenic ions directly into the P-type substrate 11 followed by a diffusion (prior to deposition of epi layer 10) to drive the dopants from 1 to 2 microns deep. The implant dose and drive-in diffusion conditions are chosen to achieve a sheet resistance of 3000 to 4000 ohms per square. The epi 10 is then grown atop the diffusion 40.

The thickness of the top epi layer (region 10) is chosen depending upon the depth of P⁻ resurf region 30 and the dopant species in the heavily doped region 40. For example, a thickness of about 8 microns is chosen for region 10, if the P⁻ resurf region 30 is approximately 5 microns deep and an arsenic dopant is used in region 40. It is possible to further reduce the top epi (region 10) thickness by reducing the P⁻ resurf region 30 thickness.

The resistivity of region 10 in prior art FIG. 2 can be from 2 to 4 ohm cm, depending on the requirements imposed by other parts of the integrated circuit. The lower the resistivity of region 10, the more difficult it is to control the charge in the P⁻ resurf region 30. The selection of thickness and resistivity of the bottom epi pinched epi charge (under P⁻ resurf region 30) of 1.5 to $2.0 \times 10^{12}$ cm⁻¹² or a pinched epi sheet resistance of 2800 to 3500 ohms per square at the end of all processing steps.

The region 10 and its sub-region 40 is disclosed as either phosphorus or arsenic doped. Arsenic is disclosed to be preferred (but is diffused after implanting) when thinner regions are desired, because arsenic has a lower diffusion coefficient than phosphorus and therefore has less auto-doping from the heavily doped region 40 into lightly doped region 10.

(b) The Invention

In accordance with the invention, region 40 of FIG. 2 is formed by an implant of arsenic or a similar slow diffusing species (not phosphorus) to a depth of about 0.1 micrometers into P substrate 11. No diffusion step follows this implant before the formation of region 10. The diffusion applied to the implant are only those subsequently carried out to form the junction patters in epitaxially grown region 10. In a typical process, such diffusion steps might increase the final depth of arsenic implant region 40 to about 3 micrometers. By contrast, the prior art initial driven implant 40 (of phosphorous or arsenic) of FIG. 2, which was diffused to 1 to 2 micrometers before layer 10 is deposited, will subsequently be driven to more than 3 microns, for example to 5 or 6 microns during the creation of junction patterns in epitaxial region 10.

The implant forming region 40 is an unmasked "blanket" implant. If desired, a masked selectively implanted arsenic layer could be formed only in the area under the high voltage devices which are to be later formed.

An exemplary manufacturing process, using the present invention for a 600 volt product is as follows:

The starting P wafer 11 may have a resistivity of 70 to 100 (preferably 90) ohm cm. The wafer is conventionally cleaned and prepared for an implant, and an As buried layer 40 is implanted with a dose of 1.1E12±about 20% at 180 kV.

The N layer 10 is then epitaxially deposited to a thickness of about 3.5 micrometers with a resistivity of about 1.0 ohm cm.

Thereafter, conventional processing steps are carried out to form junction patterns. Thus, the resurf region 30 may be formed, using conventional photolithographic masking, by a boron implant of 4.7E12 at 180 keV, followed by a diffusion drive for 5 hrs. at 1100° C. As a result of this diffusion drive, and others, the initial implant 40 will deepen, but to a far lesser extent than the prior art 1–2 micron initial diffusion.

Figure 3:
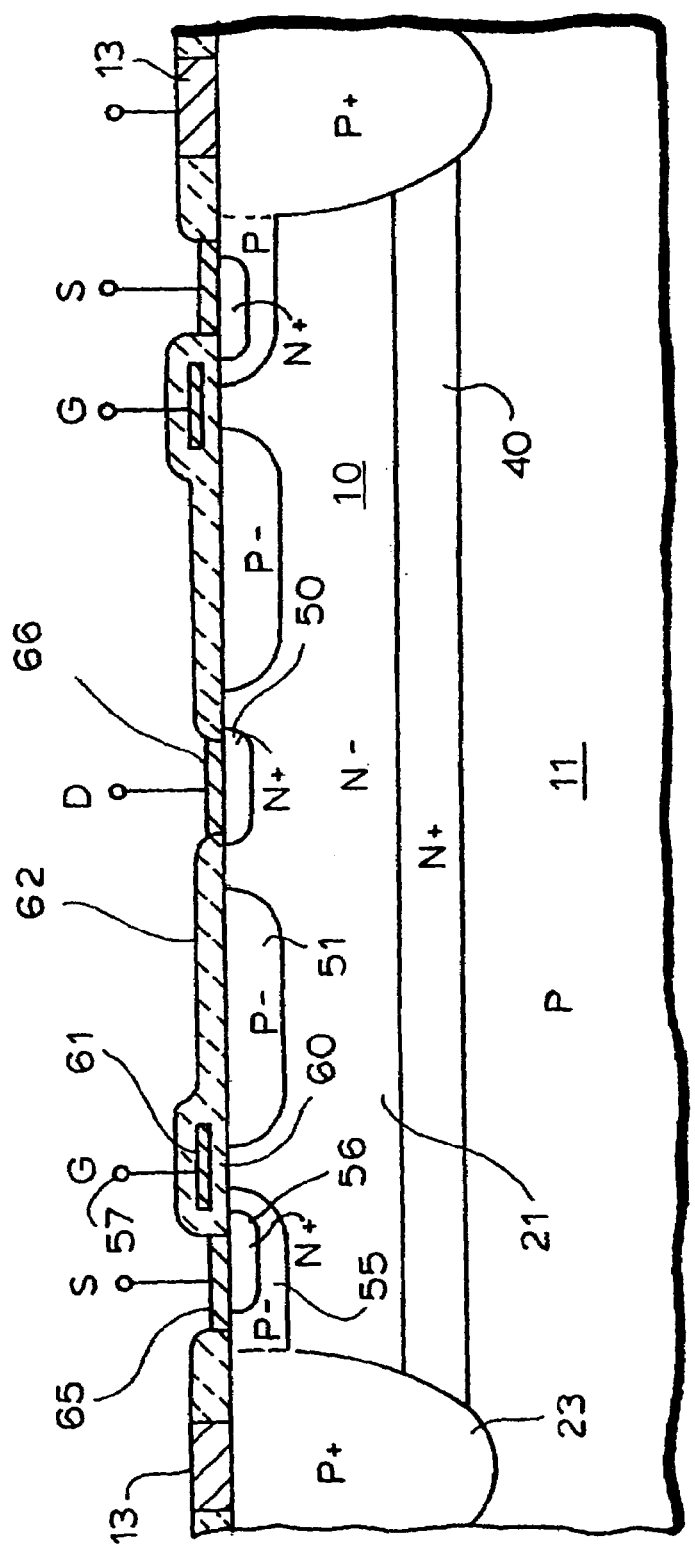
FIG. 3 shows the use of the invention for an N channel lateral conduction MOSFET which may be in another N⁻ well of the chip of FIG. 2.

FIG. 3 shows how the present invention can be used when a lateral conduction N channel MOSFET formed in well 21 of FIG. 2. Numerals similar to those of FIG. 2 designate similar parts. In FIG. 3, the junction pattern includes a central drain diffusion 50 surrounded by ring-shaped resurf diffusion 51. A ring-shaped P type base 55 containing a source ring 56 is diffused into the top surface of region 10. A suitable gate oxide 60 is formed under the polysilicon gate ring 61 and the entire surface of well 10 is covered by passivation oxide 62. Source electrode 65, which is ring-shaped, is connection to source 56 and base 55, and drain electrode 66 is connected to drain region 50. A gate electrode 57 is connected to polysilicon gate 61.

In operation, the structure of FIG. 3 will withstand a high reverse voltage between source electrode 65 and drain electrode 66, for example, 600 volts and above. To turn the device on, a voltage is applied to gate 61 which causes inversion of the channel region within base 55. Electron current can then flow from source electrode 65, through the inverted channel, under resurf diffusion 51 to drain 66.

It is to be noted that the junction pattern shown in FIG. 3 could be any other desired and known junction pattern, and could be cellular, interdigitated or the like.

In a 600 volt embodiment, the lateral distance from the outer edge of gate ring 61 to the edge of isolation diffusion 23 is about 25 microns. Region 10 is about 4 microns deep.

The gate ring 61 has a width of about 10 microns. The lateral distance between the inner edge of ring 61 to the outer edge of junction 50 is about 70 microns for a 600 volt device and about 140 microns for a 1200 volt device. P⁻ resurf region 51 may have a depth of about 1 micron. Note that manufacturing variations in the 1 micron depth will have a small effect on the "epi pinch" beneath the region 51 since about 60% of the total charge is in the pinch region.

In the case of a 1200 volt device, the above dimensions can be retained. However, the resistivity of the substrate is increased to about 200 ohm cm.

Figure 4:
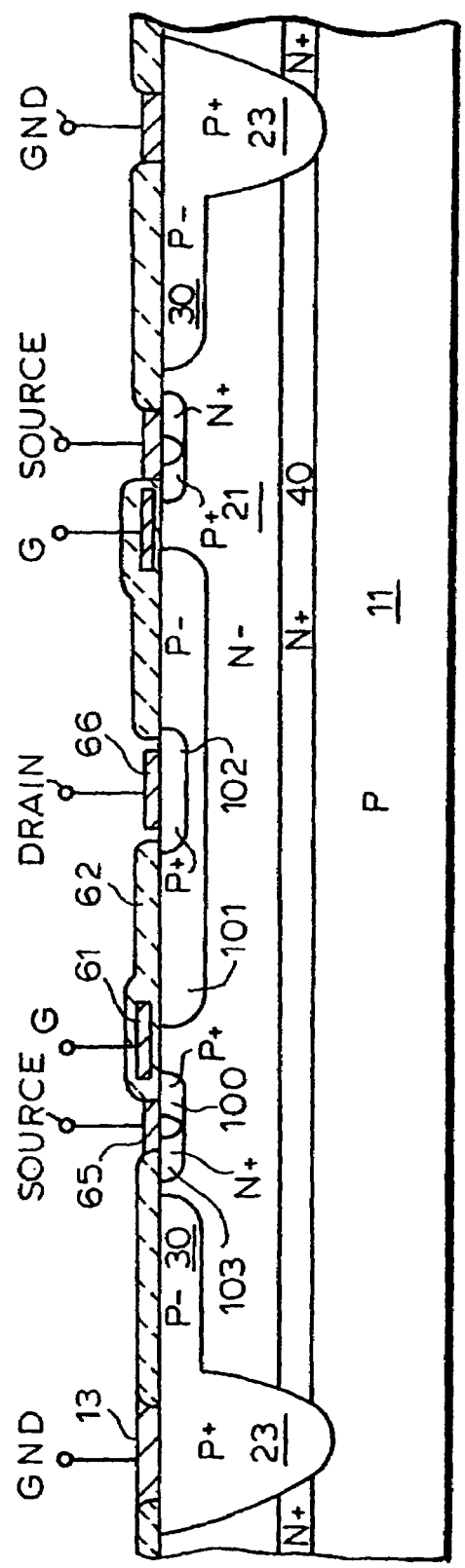
FIG. 4 shows the manner in which the invention can be implemented in a high voltage P channel MOSFET.

FIG. 4 shows the invention with a high voltage PMOS implementation. In FIG. 4, components which are similar to those of FIGS. 2 and 3 have the same identifying numerals. Thus, the structures of FIGS. 2 and 3 are combined, and gate 61 overlies the invertible channel between P⁺ region 100 and a central P⁻ region 101. A central P⁺ contact region 102 is provided to contact drain contact 66. An N⁺ contact region 103 is also provided, in contact with the edge of region 100. Ground contact 13 is connected to P⁺ region 23.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A starting wafer for containing semiconductor junctions having voltage ratings in excess of 600 volts, said wafer comprising:
    a P-type substrate;
    an unmasked blanket arsenic implant of depth less than 0.3 microns formed uniformly across and in a top surface of said substrate; and
    an N-type junction-receiving epitaxial layer deposited atop said arsenic implant formed in the surface of said substrate, said arsenic implant being diffused only due to subsequent diffusions which form junctions in said N-type junction-receiving epitaxial layer and acting as a buffer layer to the doping of said epitaxial layer from said P-type substrate.

2. The wafer of claim 1, wherein said arsenic implant is increased in thickness to less than about 5 microns by subsequent diffusions into said epitaxial layer.

3. The wafer of claim 1, wherein said P substrate is boron doped and has a resistivity of 70 ohm cm, and said arsenic implant has a resistivity defined by an implant dose of about 1.3E12 atoms per square cm.

4. The wafer of claim 2, wherein said P substrate is boron doped and has a resistivity of 70 ohm cm, and said arsenic implant has a resistivity defined by an implant dose of about 1.3E12 atoms per square cm.

5. The wafer of claim 3, wherein said epitaxial layer is phosphorus doped and has a thickness of less than about 5 micrometers and a resistivity of about 1.0 ohm cm.

6. The wafer of claim 4, wherein said epitaxial layer is phosphorus doped and has a thickness of less than about 5 micrometers and a resistivity of about 1.0 ohm cm.

7. The wafer of claim 1, wherein said arsenic implant has less than the charge in said epitaxial layer and contains about 40% of the total charge in the implant and the epitaxial layer.

8. The wafer of claim 1, wherein the total charge in said epitaxial layer and said arsenic implant is in about a 60 to 40 ratio.

* * * * *